United States Patent [19]

Yamasita et al.

[11] Patent Number: 5,214,542
[45] Date of Patent: May 25, 1993

[54] METHOD FOR PRODUCING COLOR FILTER

[75] Inventors: Yukio Yamasita; Toru Nakamura, both of Yokohama; Haruyoshi Sato, Kawasaki; Hitoshi Yuasa; Yutaka Otsuki, both of Yokohama, all of Japan

[73] Assignee: Nippon Oil Co., Ltd., Tokyo, Japan

[21] Appl. No.: 846,287

[22] Filed: Mar. 3, 1992

[30] Foreign Application Priority Data

Mar. 8, 1991 [JP] Japan .................................. 3-043596
Mar. 15, 1991 [JP] Japan .................................. 3-051565

[51] Int. Cl.$^5$ .............................................. G02B 5/22
[52] U.S. Cl. ...................................... 359/891; 359/900; 430/7
[58] Field of Search ............... 359/885, 886, 887, 888, 359/890, 891, 68, 900; 430/7, 5, 6, 293, 300, 301, 302

[56] References Cited

U.S. PATENT DOCUMENTS 4,239,842 12/1980 Sandhu .................................. 430/7
4,271,246 6/1981 Sato et al. ............................ 430/7
4,837,098 6/1989 Shimamura et al. .................... 430/7

Primary Examiner—Loha Ben
Attorney, Agent, or Firm—Darby & Darby

[57] ABSTRACT

A method for producing a color filter involves the steps of: (A) forming a photosensitive coating film on a transparent electrically conductive layer formed on a surface of a transparent substrate, and exposing the photosensitive coating film through a mask having patterns of at least three different degrees of light transmittances; (B) developing and removing a photosensitive coating film portion registering with one of the patterns of smallest and largest degrees of light transmittances for exposing the transparent electrically conductive layer, and electrodepositing a colored coating on the exposed transparent electrically conductive layer for forming a colored layer thereon; and (C) repeating the step (B) for the respective patterns of different degrees of light transmittances in sequence of difference in transmittances for producing different colored layers, respectively.

40 Claims, 2 Drawing Sheets

| (Black-Hued) Photo Sensitive Film |

| Light Exposure |

| Development |

| Electrodeposition (First Color) |

| Development |

| Electrodeposition (Second Color) |

| Development |

| Electrodeposition (Third Color) |

☐ ··· 1
▨ ··· 2
▨ ··· 3
▨ ··· 4

▨ ··· 5
▨ ··· 6
▨ ··· 7

METHOD FOR PRODUCING COLOR FILTER

BACKGROUND OF THE INVENTION

This invention relates to a method for producing a color filter and more particularly to a color filter advantageously employed as a color liquid crystal display device.

Among the currently employed methods for preparing a color filter, there are a dyeing method consisting in dyeing a transparent substrate with a binder containing dyes and pigments, a printing method and a pigment dispersion method.

Since the dyeing method consists in selectively forming a thin resin film on a substrate with dyes, a resist printing process and a photolithographic process need to be performed each time the color is changed. Although resist printing is unnecessary with the printing method, there is a limit to the refinement of color patterns and, the larger is the number of colors, the printing position becomes the worse. Although the fine color pattern is possible with the pigment dispersion method, a high precision photolithographic process needs to be performed each time the color is changed, resulting in a complicated process.

For overcoming the deficiency, there is proposed in Japanese Laid-open Patent Application No. 59-114572 (1984) a method for producing a color filter by an electrodeposition coating method. With this method, a transparent electrode is prepared by patterning a transparent electrically conductive film deposited on the substrate, and electrical voltage is applied only to a portion of the patterned transparent electrode which is to be dyed in the same color. The substrate is immersed in a colored electrodeposition bath for forming a colored layer by electrodeposition. Electric voltage is then applied only to a portion of the substrate which is to be dyed in a different color, and the substrate is then immersed in a colored electrodeposition bath for forming a different color layer by electrodeposition. However, it is necessary with this method to perform a high precision patterning of the transparent electrode, and to pay meticulous care during the subsequent process not to break the fine pattern, because otherwise the subsequent coloring process is rendered difficult. Besides, the patterned transparent electrode needs to be electrically continuous, even in fine pattern sections, so that limitations are imposed on the degree of freedom of the pattern shape.

In Japanese Laid-open Patent Application No. 63-210901 (1988), there is proposed a method consisting in forming colored layers by light exposure, development and electrodeposition, using a mask having patterns only in areas to be dyed in the same colors and a positive type photosensitive resin composition, and repeating the steps of light exposure, development and electrodeposition a desired number of times. This method is inferior in stability because it makes use of a compound containing unstable quinone diazid groups. Besides, if the quinone diazid compound is brought into contact with an aqueous alkali solution, the quinone diazid compound in the unexposed part is also reacted with an aqueous alkali solution so that photosensitivity is markedly changed to present difficulties in the subsequent light exposure and development steps.

With any of the above methods, high precision processing is required for alignment so that it is difficult to cope with the demand for a larger work size, that is a larger picture size with reduced costs.

SUMMARY OF THE INVENTION

It is a principal object of the present invention to provide a method for producing a color filter which is not in need of high precision fine processing and which has a large degree of freedom in selecting the pattern contour of the colored layers.

It is another object of the present invention to provide a method for preparing a color filter which can be adapted easily for larger picture size and which can be mass-produced easily.

The above and other objects of the invention will become apparent from the following description.

In accordance with the present invention, there is provided a method for producing a color filter comprising the steps of:

(A) forming a photosensitive coating film on a transparent electrically conductive layer formed on a surface of a transparent substrate, and exposing the photosensitive coating film through a mask having patterns of at least three different degrees of light transmittances;

(B) developing and removing a photosensitive coating film portion registering with one of the patterns of smallest and largest degrees of light transmittances for exposing the transparent electrically conductive layer, and electrodepositing a colored coating on the exposed transparent electrically conductive layer for forming a colored layer thereon; and (C) repeating the step (B) for the respective patterns of different degrees of light transmittances in sequence of difference in transmittances for producing different colored layers, respectively.

PREFERRED EMBODIMENTS OF THE INVENTION

Figure 1:
FIG. 1 is a diagram showing step by step a process for producing a color filter according to an embodiment of the present invention.
Figure 1:
Figure 1:
Figure 1:
Figure 1:
Figure 1:
Figure 1:

The present invention will be explained in more detail hereinbelow.

According to the present invention, a photosensitive coating film is formed on a transparent substrate having a transparent electrically conductive layer on its surface, and light exposure is performed via a mask having patterns of at least three different degrees of light transmittances (the step is referred to hereinafter as step A).

There is no particular limitation to the transparent substrate having a transparent electrically conductive layer, if the substrate is a transparent plate having an electrically conductive layer on its surface. Examples of the substrate may include a glass plate or a plate of transparent plastics having a transparent electrically conductive layer on its surface. The substrate preferably has a smooth surface in view of the performance desired of a color filter. The surface of the substrate may be ground if so required.

The electrically conductive layer may be formed of such materials as tin oxide, indium oxide, antimony oxide and mixtures thereof. There is no particular limitation to the methods for forming an electrically conductive layer and any of the known methods such as spraying chemical vapor deposition (CVD), sputtering or vacuum evaporation, may be employed. A commercially available transparent substrate having a transparent electrically conductive layer may be employed. The substrate is preferably of higher transparency in view of the performance desired of the color filter.

Although there is no particular limitation to the method of forming the photosensitive coating film on the transparent electrically conductive layer formed on the transparent substrate, a negative or positive type photosensitive coating may be applied on the substrate by the known methods, such as electrodeposition, spraying, dip coating, roll coating, screen printing or spin coating.

As the negative type photosensitive coating for forming the negative type photosensitive coating film, a negative type photosensitive coating resin exhibiting film forming capabilities and photosensitivity and a photopolymerization initiator may be dispersed or dissolved in a solvent such as an organic solvent or water so as to be used as a coating material. As the positive type photosensitive coating for forming the positive type photosensitive coating film, a positive type photosensitive coating resin exhibiting film coating capabilities and photosensitivity may be dispersed or dissolved in water or in an organic solvent so as to be used as a coating material. Dyes and/or pigments may be contained in the negative or positive type coatings. If the dyes and/or the pigments are of a color hue corresponding to that of the target color filter, the number of repetition of the step (C) later described may be correspondingly reduced.

The negative type photosensitive coating resin preferably employed in the present invention may include a prepolymer having photosensitive groups such as (meth)acryloyl groups, e.g. acryloyl or methacryloyl group, cinnamoyl groups or mixtures thereof at a terminal and/or side chain of the molecule, an onium group-containing cationic resin or a carboxylic group-containing anionic resin. The negative type photosensitive coating resin may have a molecular weight ranging between 500 and 10,000.

The prepolymer may preferably be formed from epoxy (meth)acrylate, urethane (meth)acrylate, polyester (meth)acrylate, or mixtures thereof.

The onium group-containing cationic resins may be composed of a main resin, such as acrylic resin, polyester resin, maleinated oil resin, polybutadiene resin, epoxy resin, urethane resin, polyamide resin or mixtures thereof, and the photosensitive groups and onium groups, such as amino group, ammonium group, sulfonium group or mixtures thereof, introduced therein. These resins may preferably be processed with an acidic substance such as formic acid, acetic acid, propionic acid, lactic acid or mixtures thereof, and solubilized and/or dispersed in water.

The carboxyl group-containing anionic resins may be composed of the above mentioned main resin into which carboxylic groups and the aforementioned photosensitive groups are introduced. These resins may preferably be solubilized and/or dispersed in basic substances, such as triethylamine, diethylamine, dimethylethanol amine, ammonia or mixtures thereof.

There is no particular limitation to the positive type photosensitive coating resin, if it is dissolved in a developing solution on light exposure, and may be enumerated by resins including quinone diazido groups, resins including diazomeldrum's acid or nitrobenzyl ester, or resin compositions including these resins. Specific examples of these resins include a quinone diazido group-containing cationic resin in which the onium groups and hydroxyl groups are introduced into the above main resins, to which a quinone diazido sulfonic acid compound is added further by esterification reaction followed by being processed with an acidic substance such as formic acid, acetic acid, propionic acid, lactic acid or mixtures thereof and solubilized and/or dispersed in water; a quinone diazido group-containing anionic resin in which carboxyl groups and hydroxyl groups are introduced into the above mentioned main resins, to which a quinone diazido sulfonic acid compound is further added by an esterification reaction followed by being processed with basic substances e.g. triethylamine, diethylamine, dimethylethanol amine, ammonia or mixtures thereof, and solubilized and/or dispersed in water; a quinone diazido group-containing resin obtained by reacting a resin having film-forming capability and a hydroxyl group-compound with a quinone diazido compound including a quinone diazido sulfonic acid derivative or an isocyanate group; and resin compositions containing these resins. The mixing ratio for the resin compositions may be optionally selected depending on light exposure and development conditions.

As the negative type photosensitive coating resin and the positive type photosensitive coating resin, prepolymers or resins that may be solubilized and/or dispersed in water are most preferred for simplifying the process and combating the pollution.

The negative type photosensitive coating resins may also be admixed with low molecular (meth)acrylates for controlling photosensitive properties and viscosity of the coating film. Examples of such (meth)acrylates include 2-hydroxyethyl (meth)acrylate, 2-phenoxyethyl (meth)acrylate, 3-phenoxy-2-hydroxypropyl (meth)acrylate, 2-ethylhexyl (meth)acrylate, tricyclodecane (meth)acrylate, hexanediol-di(meth)acrylate, trimethylolpropane triacrylate, pentaerythritol triacrylate, dipentaerythritol hexacrylate, tris(acryloyl oxyethyl) isocyanurate, and mixtures thereof. The proportion of these (meth) acrylates is preferably up to 50 and most preferably up to 30 parts by weight to 100 parts by weight of the negative type photosensitive coating resin. If the proportion of the (meth)acrylates exceeds 50 parts by weight, the coating becomes undesirably tacky.

The photopolymerization initiator employed in the negative type photosensitive coating may be any of those known in the art and may be enumerated by benzoins, benzoin ethers, benzylalkyl ketals, benzophenone derivatives, anthraquinone derivatives, thioxanthone derivatives or mixtures thereof. Sensitizers may be added thereto if so desired. The photopolymerization initiator may be added in an amount of 0.1 to 30 and preferably 0.5 to 20 parts by weight to 100 parts by weight of the negative type photosensitive coating resin. If the amount of the initiator is less than 0.1 part by weight, photocuring properties fall short, whereas, if it exceeds 30 parts by weight, curing proceeds excessively and hence the coating film becomes poor in strength, while economic advantages are also lost.

The organic solvent used for dispersing or dissolving the components of the negative and positive type photosensitive coating resins may be any of those capable of dispersing or dissolving the above mentioned prepolymers or resins. Examples of the solvents include glycol ethers, such as ethyleneglycol monobutyl ether, ethyleneglycol monohexyl ether, ethyleneglycol monophenyl ether, propyleneglycol monomethyl ether, propyleneglycol monophenyl ether, diethyleneglycol dimethyl ether or triethyleneglycol dimethyl ether; ketones such as acetone, methylethyl ketone, methylisobutyl ketone, cyclohexanone or isophorone; ethers such as dibutyl ether, dioxane or tetrahydrofuran; alcohols such as methoxy butanol, diacetone alcohol, butanol or isopropanol; hydrocarbons such as toluene, xylene or hexane; esters such as ethyl acetate, butyl acetate, 2-methoxyethyl acetate, 2-methoxypropyl acetate or ethyl benzoate; acid amides such as dimethyl formamide, N,N-dimethyl acetoamide or dimethyl sulfoxide, and mixtures thereof.

These organic solvents may be added during solubilization or dispersion in water of the above mentioned cationic or anionic resins for improving bath stability or smoothing coating films.

Although the color hue of the dyes and/or pigments occasionally added to the above mentioned negative or positive type photosensitive coating may be suitably selected depending on the particular application, it is preferably dark and, above all, black, dark navy-blue, dark purple or dark brown, for avoiding light leakage.

The dyes and/or the pigments are preferably so selected as not to lower the stability and occasionally electrodeposition properties as well as durability of the coating. For this reason, oil soluble or dispersible dyes, such as azo, anthraquinone, benzodifuranone, condensed methine series dyes, or mixtures thereof, are preferred. The pigments may be exemplified by organic pigments, such as azo lake organic pigments, quinacridone organic pigments, phthalocyanine organic pigments, isoindolinone organic pigments, anthraquinone organic pigments or thioindigo organic pigments; chrome yellow, iron oxide, chrome vermilion, chrome green, ultramarine, prussian blue, cobalt blue, cobalt green, emerald green, titanium white, carbon black or mixtures thereof. As for the color hue of the dyes and pigments, reference is had to "COLOUR INDEX" whenever necessity arises.

The amount of the dyes and/or the pigments is suitably selected depending on the application, color hue, the type of the dyes and/or the pigments or the film thickness of the photosensitive coating. The amount may preferably be 3 to 70 wt. % and more preferably 5 to 60 wt. % based on the total photosensitive coating.

Depending on the type and the amounts of the dyes and/or pigments, the produced coating film may be rendered light transmitting or light intercepting according to the intended applications. For example, black tinted light-intercepting coating film may be produced by using 3 to 34 wt. % of carbon black, as pigments, based on the total amount of the negative or positive type photosensitive coating. The black-hued light-intercepting coating film is particularly desirable for preventing light leakage. The color hue of the dyes and/or the pigments may include white color hue. The dyes and/or the pigments are preferably purified for removing impurities. The photosensitive coating may be admixed with various assistant agents, such as dispersants for the dyes and/or the pigments, levelling agents for improving smoothness of the coating film, viscosity adjustment agents or defoaming agents.

For producing the negative type photosensitive coating, the negative type photosensitive coating resins, the photopolymerization initiator and the solvent are sufficiently dispersed, using a dispersion apparatus, such as customary sand mills, roll mills or attriters. The positive type photosensitive coating may be prepared by mixing and dispersing the resins for the positive type photosensitive coating and the solvent in the same manner as for the negative type coating. The dyes, pigments, acidic or basic substances, dispersants, levelling agents for improving smoothness of the coating film, viscosity adjustment agents or defoaming agents may be mixed and dispersed as needed. There is no limitation to the film thickness of the photosensitive coating films formed by the photosensitive coating and the film thickness may be suitably selected depending on the performance desired of the color filter. The dry film thickness may be usually 0.3 to 5 $\mu$m and preferably 1 to 3 $\mu$m. The film thickness may be adjusted by controlling, for example electrodeposition conditions, such as voltage, electrodeposition time and bath temperature. However, film thickness adjustment may be usually made under the same conditions as those for electrodeposition coating of colored coatings, as will be explained subsequently.

According to the present invention, exposure of the photosensitive coating film is to be performed by using a mask having patterns of at least three different degrees of light transmittances. The light transmittance means an intensity ratio before and after transmission of the exposure light through the mask. At least three different light transmittance degrees of the mask patterns will suffice depending on the number of types of the colored coatings. The difference in the light transmittance degrees may be optionally determined depending on the conditions of light exposure and development. In general, the larger the relative difference in the respective light transmittances, the easier becomes the adjustment of light exposure time, which is more desirable. However, even if the difference in the light transmittances is small, the same objective may be achieved by enhancing the volume of light exposure or prolonging the light exposure time. Thus, a significant difference of 5% or more is desirable, although no limitations are placed on the relative difference in the light transmittances.

Light exposure may be usually achieved using a system radiating a large quantity of ultraviolet rays. For example, a high pressure mercury lamp, an ultra high pressure mercury lamp or a metal halide lamp may be used as a light source. If necessary, other radiation rays may also be employed. Light exposure conditions may be selected suitably depending on photosensitive coatings employed, light exposure devices and masks.

In the step (A) of the present invention, by effecting light exposure through a mask having patterns of at least three different degrees of light transmittances, a number of different exposure states which is the same as that of the different light transmittance degrees of the patterns may be provided in the photosensitive coating film.

In the method of the present invention, the step of forming a colored layer by applying a colored coating by electrodeposition on the transparent electrically conductive layer exposed after developing and removing the photosensitive coating film is repeated, next to the step (A), in the order of the increasing light transmittance degrees of the patterns with use of the negative type photosensitive coating and in the order of the decreasing light transmittance degrees of the patterns with use of the positive type photosensitive coating, for producing the respective colored layers. That is, if the negative type photosensitive coating is employed, the portion of the photosensitive coating film corresponding to a pattern of the smallest degree of light transmittance of the patterns is selectively developed and removed, and the colored coating is electrodeposited on the exposed transparent electrically conductive layer to form a colored layer (step B). The portion of the coating film corresponding to the second smallest light transmittance degree of the patterns is then selectively developed and removed and the colored coating is electrodeposited on the exposed electrically conductive layer to form a colored layer. This sequence of operations is repeated to produce the colored layers, respectively (step C). If the positive type photosensitive coating is employed, the portion of the photosensitive coating film corresponding to a pattern of the largest light transmittance of the mask is selectively developed and removed and a colored coating is electrodeposited on the exposed transparent electrically conductive layer to form a colored layer (step B). The portion of the coating film corresponding to the second largest light transmittance degree of the patterns is then selectively developed and removed and a colored coating is electrodeposited on the exposed electrically conductive layer to form a colored layer. This sequence is repeated to produce the respective colored layers (step C).

The conditions for selectively developing and removing the photosensitive coating film may be changed depending on the volume of light exposure, solubility of the photosensitive coating in the developing solution, the types and the concentrations of the developing solution, development time and temperatures. Thus, the conditions may be suitably selected for the resin used for the preparation of the photosensitive coating. Specifically, aqueous solutions containing dissolved acidic materials may be used as a developing solution when the cationic resin is used as a component of the negative photosensitive coating. The acidic materials include organic acids, such as formic acid, acetic acid, propionic acid or lactic acid; inorganic acids, such as hydrochloric acid or phosphoric acid; and mixtures thereof. If lactic acid is used as a developing solution, it may be used at a concentration usually of 0.01 to 50 wt. % and preferably 0.01 to 30 wt. %. The developing temperature is usually 10° to 70° C. and preferably 20° to 50° C. and the developing time is usually 5 to 600 seconds. As a developing solution in case of employing an anionic resin as a component of the negative type photosensitive coating and as a developing solution for the positive type photosensitive coating, an aqueous solution containing basic substances dissolved therein, may be employed. The basic substances may include sodium carbonate, sodium hydrogen carbonate, sodium metasilicate tetraalkyl ammonium hydroxide, sodium hydroxide, potassium hydroxide and mixtures thereof. If an aqueous solution of sodium carbonate is used as a developing solution, sodium carbonate may be used in a concentration range of 0.01 to 25 wt. % and preferably 0.05 to 15 wt. % for development. The development time usually is selected within a range of 5 to 600 and preferably 5 to 300 seconds generally at 10° to 70° C. For the developing solutions, organic solvents such as alcohols, glycol ethers, ketones, chlorinated hydrocarbons or mixtures thereof, may be employed. Surfactants or defoaming agents may also be added to these developing solutions for improving wettability or anti-foaming properties. Aqueous developing solutions are preferably employed in view of non-toxicity and sanitation in working environments.

After the development, colored coatings are electrodeposited on the exposed transparent electrically conductive layer for forming a colored layer.

In preparing the colored coating, cationic resins, anionic resins or photocurable resins are used as a film-forming component, and dyes and/or pigments are added as a colorant component. Acidic or basic substances may also be employed for dissolving and/or dispersing these components in water. Organic solvents may be added for facilitating dissolution and/or dispersion of the resins in the colored coating for improving bath stability or for producing smooth coating films.

The cationic resins may for example be resins composed of the main resins used in the photosensitive coating into which onium groups such as ammonium, sulfonium groups or amino groups are introduced, such as resins solubilized or dispersed in water with an acidic substance, such as formic acid, acetic acid, propionic acid, lactic acid or mixtures thereof.

The anionic resins may for example be resins composed of the main resins used in the photosensitive coating into which carboxyl groups, etc. are introduced, and may for example be resins solubilized or dispersed in water with basic substances such as triethylamine, diethylamine, dimethylethanol amine, ammonia or mixtures thereof.

As the photocurable resins, those prepolymers or resins containing acryloyl groups, methacryloyl groups, cinnamoyl groups or mixtures thereof, that are used in the photosensitive coating film in the step (A) and that are suited for electrodeposition, may be employed. The above mentioned photopolymerization initiators may also be employed in combination.

The colored coatings employed in steps (B) and (C) may be different in type, color hue, color concentration or color brightness in the regions exhibiting different light transmittances. Alternatively, the same colored coatings may be used in common for these regions.

The color hue of the colored coating may be selected suitably, depending on particular applications. For example, the photosensitive coating used in step (A), the colored coating used in steps (B) and (C) and the colored coatings used in steps (B) and (C) in case of repeating the electrodepositing process several times, may be those exhibiting different color hues.

The dyes and/or pigments used in the colored coatings may be suitably selected depending on the targeted color hue. It is, however, preferred to use those dyes and/or pigments which are not unsatisfactory in transparency, stability, electrodeposition properties and durability of the coating film. Particularly preferred are those dyes or pigments which may be mixed as the occasion may demand in the above mentioned photosensitive coatings.

In the preparation of the colored coatings, resins, dyes and/or pigments, acidic or basic substances, organic solvents, dispersants for the dyes or pigments, levelling agents for improving smoothness of the coating films, viscosity controlling agents or anti-foaming agents are mixed together and dispersed sufficiently in a conventional dispersion device such as sand mill, roll mill or attriter. The resulting dispersion is diluted in water to a predetermined concentration of about 4 to 25 wt. % and preferably to 7 to 20 wt. % of solid content to produce a coating suitable for electrodeposition. The so-produced coating may be applied on the electrically conductive layer by electrodeposition for providing a colored layer.

There is no particular limitation to the film thickness of the colored layer, which may be suitably selected depending on the performance required of a color filter. However, the dry thickness is usually 0.3 to 5 μm and preferably 1 to 3 μm.

Although the conditions of electrodeposition may be suitably selected depending on the types of the colored coatings and film thickness of the colored coating films, the electrical voltage is usually 5 to 500 V dc and preferably 10 to 300 V dc, the electrodeposition time is usually 5 to 300 sec and preferably 10 to 200 sec and the liquid temperature is usually 10° to 35° C. and preferably 15° to 30° C. After lapse of the electrodeposition time sufficient to produce a desired film thickness, current conduction is discontinued and the substrate is taken out of the bath. The substrate is freed of excess bath liquid by washing with water and dried to produce the colored layer.

Although the drying conditions may be selected suitably depending on the conditions of the subsequent process steps, it is usually preferred that the conditions be such that surface moisture is dried, for example, the drying time be of the order of 1 to 20 minutes and preferably 2 to 10 minutes at a temperature of 120° C. or lower and preferably 30° to 100° C. If the drying temperature is higher than 120° C., the photosensitive coating film is occasionally cured under heat to raise difficulties in the subsequent development process.

Although the desired color filter may be produced by the above described steps (A), (B) and (C), heating, curing or photocuring may be effected, if needed, for further improving weatherability or resistance to chemicals. If heating or curing is effected, the temperature is usually 100° to 250° C. and preferably 150° to 250° C. and the processing time is usually 5 minutes to one hour and preferably 15 to 40 minutes.

The process of the present invention will be explained further by referring to the drawings, merely for the sake of illustration.

The process of the present invention will first be explained by referring to FIGS. 1 and 2 in the case of employing a negative type photosensitive coating as a photosensitive coating material for producing the photosensitive coating film.

FIG. 1 shows a process according to an embodiment of the present invention. FIG. 2 is a schematic plan view showing a mask having four different degrees of light transmittances, according to an embodiment of the present invention. If the negative type photosensitive resin is employed, 1, 2, 3 and 4 denote mask regions registering with a light-blocking film region with 100% light transmittance, a first color hue region with 5% light transmittance, a second color hue region with 25% light transmittance and a third color hue region with 80% light transmittance, respectively.

A black hue negative type photosensitive coating film, which is to be a light intercepting film, is formed on a transparent electrically conductive layer formed on the surface of a transparent substrate. The electrically conductive layer on the substrate in a dry state is exposed to light via a mask shown in FIG. 2, by way of effecting first development, for laying open a region of the electrically conductive layer on the substrate in register with the first color hue 5% transmittance mask region 2. The substrate is then immersed in an electrodeposition bath containing a first colored coating to effect coating by electrodeposition, followed by washing with water.

The second development is then effected under the conditions different from those used for the first development, for laying open a region of the electrically conductive layer in register with the second color hue 25% transmittance mask region 3. The substrate is then immersed in an electrodeposition bath containing a second colored coating to effect coating by electrodeposition, followed by washing with water.

The third development is then effected under the conditions different from those used for the first and second development, for laying open a region of the electrically conductive layer in register with the third color hue 80% transmittance mask region 4. The substrate is then immersed in an electrodeposition bath containing a third colored coating to effect coating by electrodeposition, followed by washing with water and drying, whereby colored layers having the light intercepting film are formed to produce a color filter.

Referring again to FIGS. 1 to 3, the process of the present invention employing a positive type photosensitive coating will be explained.

Figure 2:
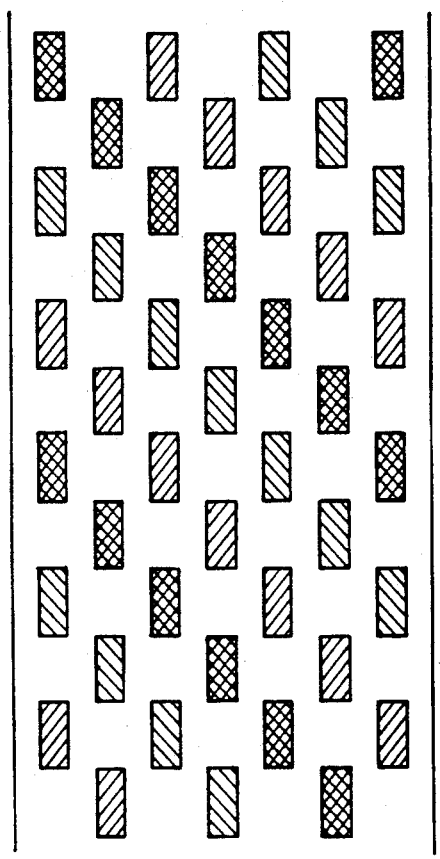
FIG. 2 is an enlarged schematic view showing a mask employed in some Examples of the invention.
Figure 3:
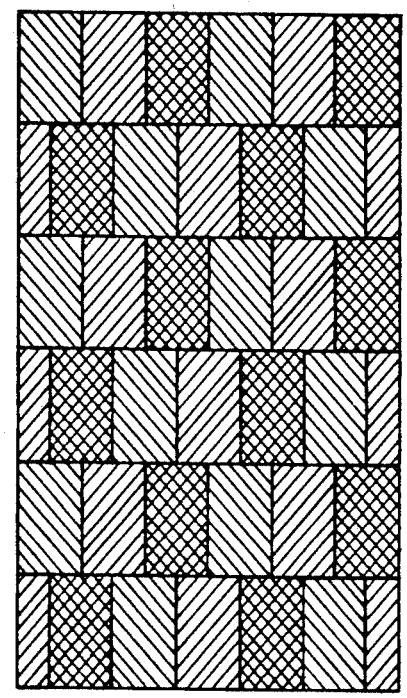
FIG. 3 is an enlarged schematic view showing a mask employed in another Example of the present invention.

FIG. 1 shows a process similar to that used when employing the above mentioned negative type photosensitive resin, and FIG. 2 shows, in an enlarged schematic plan view, a mask of the present invention having four degrees of different light transmittances, wherein 1, 2, 3 and 4 denote mask regions registering with a light intercepting film region with 1% light transmittance, a first color hue region with 100% light transmittance, a second color hue region with 50% light transmittance and a third color hue region with 25% light transmittance, respectively. FIG. 3 is an enlarged schematic plan view showing a mask of the present invention having three degrees of different light transmittances, wherein 5, 6 and 7 denote mask regions registering with a third color hue region with 1% light transmittance, a first color hue region with 100% light transmittance and a second color hue region with 25% light transmittance, respectively.

A black hue positive type photosensitive coating film, which is to be a light intercepting film, is formed on a transparent electrically conductive layer formed on the surface of a transparent substrate. The electrically conductive layer on the substrate in a dry state is exposed to light via a mask shown in FIG. 2 by way of effecting first development, for laying open a region of the electrically conductive layer in register with the first color hue maximum transmittance mask region 2. The substrate is then dipped in an electrodeposition bath containing a first colored coating to effect coating by electrodeposition, followed by washing with water.

The second development is then carried out under the conditions different from those used for the first development, for laying open a region of the electrically conductive layer in register with the second color second largest transmittance mask region 3. The substrate is then dipped in an electrodeposition bath containing a second colored coating to effect coating by electrodeposition, followed by washing with water.

The third development is then carried out under the conditions different from those used in the first and second developments, for laying open a region of the electrically conductive layer in register with the third color third largest transmittance mask region 4. The substrate is then dipped in an electrodeposition bath containing a third colored coating to effect coating by electrodeposition followed by washing with water and drying. In this manner, the colored layers having a light intercepting film are formed for producing a color filter of the present invention. The same operational sequence may be used when employing a positive type mask shown in FIG. 3.

If the positive type photosensitive coating is employed in the present invention, there may be preferably employed a method consisting in using a coating material obtained by dissolving and/or dispersing cationic resins in water, effecting coating by electrodeposition and forming colored layers with a colored coating prepared by using anionic resins, or conversely, a method consisting in using, as a positive type photosensitive coating, a coating material obtained by dissolving and/or dispersing anionic resins in water and forming colored layers by using a colored coating prepared from cationic resins.

With the present method for producing a color filter, patterning may be achieved by one light exposure operation with an increased degree of freedom in the patterned shapes of the colored layers without the necessity of highly advanced fine processing techniques while increased color filter size can be coped with. Thus, the color filter may be mass-produced relatively easily.

EXAMPLES OF THE INVENTION

The present invention will be explained hereinbelow with reference to Synthesis Examples and Examples which are given only for illustration and are not intended for limiting the invention.

Synthesis Example 1

Synthesis of Amine-added Expoxidated Polybutadiene (a-1)

1,000 g of epoxidated liquid polybutadiene, manufactured by NIPPON PETROCHEMICALS CO., LTD. under the trade name of "E-1000-8", with a number average molecular weight of 1,000 and an oxirane oxygen content of 8%, were charged into a 2 lit separable flask, fitted with a thermometer, stirrer and a reflux cooling pipe. After replacing the atmosphere within the system by nitrogen, 231.2 g of methylethanol amine were added and reaction was carried out at 170° C. for five hours. Non-reacted methylethanol amine was then distilled off under reduced pressure to produce amine-added epoxidated polybutadiene (a-1) with an amine value of 230.4 mmol/100 g.

Synthesis of Unsaturated Group-Containing Isocyanate Compound 435.5 g of 2,4-tolylene diisocyanate and 266.1 g of diethylene glycol dimethyl ether were charged into a 2 lit round-bottom flask, which may be heated and cooled and which was fitted with a thermometer, a stirrer, a reflux cooling pipe and a dropping funnel. After heating to 40° C., 362.8 g of 2-hydroxyethyl acrylate were added dropwise from the dropping funnel. 200 ppm of p-benzoquinone was also added at this time. Since some heat was evolved due to dropwise addition of 2-hydroxyethyl acrylate, the system was occasionally cooled for maintaining the constant temperature. After the end of the dropwise addition of 2-hydroxyethyl acrylate, the temperature was raised to 70° C., at which temperature the reaction was carried out for three hours. After the IR absorption spectral analyses revealed that the absorption intensity of the isocyanate groups was decreased to about one half that before start of the reaction, the reaction system was cooled to produce an unsaturated group-containing isocyanate compound (a-2).

Synthesis of Photosensitive Resin (A-1)

500 g of (a-1) were dissolved in 166.7 g of diethylene glycol dimethyl ether in a 2 lit separable flask. 713.4 g of (a-2), in which isocyanate groups are contained in an amount of 0.8 equivalent to 1 equivalent of hydroxyl groups, were added dropwise at 40° C., at which temperature the reaction was carried out for one hour. The IR absorption spectral analyses indicated that the isocyanate groups had disappeared. A photosensitive resin (A-1), in which (a-2) was added to (a-1), was produced.

Synthesis Example 2

Synthesis of Polyamine (A-2) Solution 1,000 g of "NISSEKI POLYBUTADIENE B-1000", trade name of a product manufactured by NIPPON PETROCHEMICALS CO., LTD., with a number average molecular weight of 1,000, an iodine value of 430, and 1,2-linkage of 65 percent, 554 g of maleic anhydride, 10 g of xylene and 3.0 g of trimethyl hydroquinone, were charged into 3 lit separable flask, fitted with a thermometer, a stirrer, a reflux cooling pipe and a nitrogen blowing tube, and reaction was carried out under nitrogen at 190° C. for five hours. After non-reacted maleic anhydride and xylene were distilled off, maleinated polybutadiene with a total acid value of 400 mg KOH/g, was produced.

Then, 1,000 g of the maleinated polybutadiene and 433 g of ethylene glycol monobutyl ether were charged and uniformly dissolved in a 3 lit separable flask fitted with a reflux cooling pipe. 364.3 g of N,N-dimethyl amino propylamine were added dropwise over one hour, while the temperature of 135° C. was maintained under a nitrogen stream. After the same temperature was maintained for five hours, a polyamine solution containing tertiary amino groups and imido groups (A-2 solution) was produced. The produced polyamine (A-2 solution) contained 206 mmols of tertiary amines per 100 g of solution, with the non-volatile content amounting to 75.0 wt. %.

Synthesis Example 3

Synthesis of Half-Esterified Product (A-3) solution 1,000 g of "NISSEKI POLYBUTADIENE B-1000", trade name of a product manufactured by NIPPON PETROCHEMICALS CO., LTD., with a number average molecular weight of 1,000, an iodine value of 430, and 1,2-linkage of 65 percent, 554 g of maleic anhydride, 10 g of xylene and 3.0 g of trimethyl hydroquinone were charged into 3 lit separable flask, fitted with a thermometer, a stirrer, a reflux cooling pipe and a nitrogen blowing tube, and reaction was carried out under nitrogen at 190° C. for five hours. After non-reacted maleic anhydride and xylene were distilled off, maleinated polybutadiene with a total acid value of 400 mg KOH/g was produced.

Then, 1,000 g of the maleinated polybutadiene and 461.8 g of diethylene glycol dimethyl ether, 3.0 g of N,N-dimethyl benzyl amine and 385.5 g of benzyl alcohol were charged into a 3 lit flask fitted with a reflux cooling tube. After the mixture was dissolved uniformly, reaction was carried out under nitrogen at 120° C. for two hours to produce a half-esterified product (A-3) in solution. The total acid value of the produced half-esterified product (A-3) in solution was 109.3 mg KOH/g and the non-volatile content amounted to 75.0 wt. %.

Synthesis Example 4

Synthesis of Resin (A-4)

400 g of the maleinated polybutadiene obtained in Synthesis Example 3, 188.5 g of diethylene glycol dimethyl ether and 0.4 g of hydroquinone were charged into a 2 lit separable flask fitted with a reflux cooling tube. After the temperature was raised to 80° C., the mixture was agitated and homogenized. Then, 165.6 g of 2-hydroxyethyl acrylate and 20 g of triethylamine were added and reaction was carried out at the above temperature for two hours to produce a solution of a half-esterified product of the maleinated polybutadiene (A-4). The total acid value of the produced half-esterified product (A-4) solution was 105 mg KOH/g and the non-volatile content amounted to 75.0 wt. %.

Synthesis Example 5

Preparation of black-Hued Photosensitive Coating (B-1)

To 500 g of the photosensitive resin (A-1) produced in Synthesis Example 1, were added, as photopolymerization initiators, 27.0 g of "IRGACURE 907", a product manufactured by CIBA GEIGY INC., 3.0 g of "KAYACURE DETX", a product manufactured by NIPPON KAYAKU CO., LTD. and 37.5 g of carbon black #5B, a product manufactured by MITSUBISHI KASEI CORPORATION, under agitation and mixed together. The mixture was dispersed by a laboratory 3-roll roll mill, manufactured by KODAIRA SEISAKUSHO KK, until the carbon black particle size was 0.3 μm or less. Particle size was measured using a COULTER counter N4 manufactured by COULTER INC.

16.7 g of acetic acid, as a neutralizer, was added to the dispersion, and the resulting mass was again agitated thoroughly and homogenized. As deionized water was added slowly, the reaction mass was mixed vigorously by a high speed mixer and dispersed in water to produce an aqueous solution of a cation electrodeposition type black-hued photosensitive coating (B-1) having a solid concentration of 15 wt. %.

Synthesis Example 6

Preparation of Black-Hued Photosensitive Coating (B-2)

To 500 g of the half-esterified product (A-4) produced in Synthesis Example 4, were added, as photopolymerization initiators, 27.0 g of "IRGACURE 907", a product manufactured by CIBA GEIGY INC., 3.0 g of "KAYACURE DETX", a product manufactured by NIPPON KAYAKU CO., LTD. and 37.5 g of carbon black #5B, a product manufactured by MITSUBISHI KASEI CORPORATION, under agitation and mixed together. The mixture was dispersed by a laboratory 3-roll roll mill, manufactured by KODAIRA SEISAKUSHO KK, until the carbon black particle size was 0.3 μm or less. Particle size was measured using a COULTER counter N4 manufactured by COULTER INC.

33.7 g of triethylamine as a neutralizer was added to the dispersion and the resulting mass was again agitated thoroughly and homogenized. As deionized water was added slowly, the reaction mass was mixed vigorously by a high speed mixer and dispersed in water to produce an aqueous solution of an anion electrodeposition type black-hued photosensitive coating (B-2) having a solid concentration of 15 wt. %.

Synthesis Example 7

Preparation of Black-Hued Photosensitive Coating (B-3)

To 500 g of the photosensitive resin (A-1) produced in Synthesis Example 1, were added, as photopolymerization initiators, 27.0 g of "IRGACURE 907", a product manufactured by CIBA GEIGY INC., 3.0 g of "KAYACURE DETX", a product manufactured by NIPPON KAYAKU CO., LTD. and 37.5 g of carbon black #5B, a product manufactured by MITSUBISHI KASEI CORPORATION, under agitation and mixed together. The mixture was dispersed by a laboratory 3-roll roll mill, manufactured by KODAIRA SEISAKUSHO KK, until the carbon black particle size was 0.3 μm or less. Particle size was measured using a COULTER counter N4 manufactured by COULTER INC.

The dispersion mixture was diluted with methylethyl ketone to a solid concentration of 40 wt. % to produce a solution of a black-hued photosensitive coating (B-3).

Synthesis Example 8

Preparation of Colored Coatings (C-1, C-2 and C-3)

Each half ester (A-3) in solution and pigments were mixed together under agitation and dispersed by a laboratory 3-roll roll mill, manufactured by KODAIRA SEISAKUSHO KK, until the pigment particle size of not more than 0.3 μm was reached. The particle size was measured using a COULTER counter N4 (manufactured by COULTER INC.). To each of the so-produced dispersion mixtures, there was added triethylamine as a neutralizer, and each resulting mixture was again agitated throughly and homogenized. The resulting mass was dispersed in water under agitation vigorously by a high speed mixer while adding radually deionized water, to prepare each of the colored coatings (C-1, C-2 and C-3) having solid concentrations of 10 wt. %. The compositions of the produced anionic electrodeposition type aqueous solutions of the produced three color coatings are shown in Table 1, wherein the numerical values denote parts by weight.

TABLE 1

| Coating No. | C-1 | C-2 | C-3 |
|---|---|---|---|
| Color | Red | Green | Blue |
| Half-Ester (A-3) Solution | 213.3 | 213.3 | 213.3 |
| Triethylamine (Neutralizer) | 21.0 | 21.0 | 21.0 |
| Ion-exchanged water | 1725.7 | 1725.7 | 1725.7 |
| Phthalocyanine Blue(*) | — | — | 20 |
| Phthalocyanine Green(**) | — | 20 | — |
| Azo Metal Salt Red Pigment(***) | 20 | — | — |

(*)SR-150C manufactured by SANYO SHIKISO KK
(**)SAX manufactured by SANYO SHIKISO KK
(***)Pigment Red 4BS manufactured by SANYO SHIKISO KK Synthesis Example 9

Preparation of Colored Coatings (C-4, C-5 and C-6)

Polyamine (A-2) in solution and pigments were mixed together under agitation and dispersed by a laboratory 3-roll roll mill, manufactured by KODAIRA SEISAKUSHO KK, until the pigment particle size of not more than 0.3 μm was reached. The particle size was measured using a COULTER counter N4 (manufactured by COULTER INC.). To the so-produced dispersion mixtures, there was added acetic acid as a neutralizer, and the resulting mixture was again agitated thoroughly and homogenized. Each of the resulting masses was dispersed in water under gradual addition of deionized water and vigorous agitation by a high speed mixer to prepare colored coatings (C-4, C-5 and C-6) each having a solid concentration of 10 wt. %. The compositions of the produced cationinc electrodeposition type aqueous solutions of the three color coatings are shown in Table 2, wherein the numerical values denote parts by weight.

TABLE 2

| Coating No. | C-4 | C-5 | C-6 |
|---|---|---|---|
| Color | Red | Green | Blue |
| Polyamine (A-2) solution | 213.3 | 213.3 | 213.3 |
| Acetic acid (neutralizer) | 19.8 | 19.8 | 19.8 |
| Ion-exchanged water | 1726.9 | 1726.9 | 1726.9 |
| Phthalocyanine Blue(*) | — | — | 20 |
| Phthalocyanine Green(**) | — | 20 | — |
| Azo Metal Salt Red Pigment(***) | 20 | — | — |

(*)SR-150C manufactured by SANYO SHIKISO KK
(**)SAX manufactured by SANYO SHIKISO KK
(***)Pigment Red 4BS manufactured by SANYO SHIKISO KK Synthesis Example 10

Synthesis of Cationic Positive Type Photosensitive Resin (A-5)

Synthesis of Unsaturated Compound (a-3)

148 parts of glycidol, 0.8 part of dibutyl tin dilaurylate, 0.2 part of hydroquinone monomethyl ether and 82 parts of 2-ethoxyethyl acetate were charged into a 1 lit separable flask fitted with a thermometer, an agitator, a reflux cooling tube, a gas inlet pipe and a dropping funnel, and the temperature was raised to 50° C. 319 parts of methacryloyloxyethyl isocyanate were added dropwise over an hour as air was blown into the system and reaction was carried out until absorption of the isocyanate groups in IR absorption spectrum substantially disappeared. 276 parts of 4-hydroxy benzoic acid were added, and the temperature was raised to 110° C. After it was confirmed that the acid value was not more than 5 and the epoxide equivalent weight was not less than 11,000, the reaction was discontinued to produce an unsaturated compound (a-3).

Synthesis of Cationic Positive Type Photosensitive Resin (A-5)

238 parts of diethylene glycol monoethyl ether were charged into a 1 lit separable flask fitted with a thermometer, an agitator, a reflux cooling tube and a dropping funnel, and the temperature was raised to 130° C. Into this mixture, a mixed solution composed of 145 parts of (a-3), 83 parts of isobutyl methacrylate, 167 parts of ethyl acrylate, 78 parts of ethyl methacrylate, 41 parts of dimethylaminoethyl methacrylate and 12 parts of t-butyl peroxy-2-ethyl hexanoate were added dropwise over three hours. After lapse of 30 minutes, a mixed solution of 25 parts of diethylene glycol monoethyl ether and 2 parts of t-butyl peroxy-2-ethyl hexanoate was added dropwise over 30 minutes. The resulting mass was maintained at this temperature for two hours to terminate the reaction. 500 parts of the produced acrylic resin solution were taken into a 3 lit separable flask fitted with a thermometer, an agitator, a reflux cooling tube, a nitrogen inlet pipe and a dropping funnel. Into this mixture 1570 parts of acetone and 60.1 parts of 1,2-naphthoquinone diazido-5-sulfonyl chloride were added, and the resulting mass was agitated throughly at room temperature. Into the resulting mixture, 26.7 parts of triethylamine were added dropwise over an hour, and reaction was continued for further two hours. The produced solution was filtered to remove impurities. The resulting mass was added dropwise over about one hour into a 20-fold quantity of well-agitated water and precipitated resins were recovered. After removal of the moisture under reduced pressure, a brownish cationic positive type photosensitive resin (A-5) was produced.

Synthesis Example 11

Synthesis of Anionic Positive Type Photosensitive Resin (A-6)

Synthesis of Anionic Resin (a-4)

1,000 g of "NISSEKI POLYBUTADIENE B-1000" (manufactured by NIPPON PETROCHEMICALS CO., LTD.; number average molecular weight, 1,000; iodine value, 430; content of 1,2-linkage, 65%), 751 g of maleic anhydride, 10 g of xylene and 5.0 g of trimethyl hydroquinone, were charged into a 3 lit separable flask fitted with a thermometer, an agitator, a reflux cooling tube and a nitrogen blowing pipe, and reaction was carried out at 190° C. for 5 hours under nitrogen. After non-reacted maleic anhydride and xylene were distilled off, maleinated polybutadiene with a total acid value of 480 mg KOH/g was produced.

Then, 500 g of the maleinated polybutadiene, 218 g of phenoxyethanol and 205 g of diethylene glycol dimethyl ether were charged into a 2 lit separable flask fitted with a reflux cooling tube, and dissolved homogeneously. Reaction was then carried out under nitrogen at 130° C. for three hours. Then, 61 g of benzylamine were added dropwise for 30 minutes at the same temperature and the temperature was raised to 165° C. Reaction was carried out at this temperature for seven hours to produce a solution of an anionic resin (a-4) containing half ester and imide groups.

Synthesis of Photosensitive Resin (a-5)

1000 g of "NISSEKI POLYBUTADIENE B-1000" (manufactures by NIPPON PETROCHEMICALS CO., LTD.; number average molecular weight, 1,000; iodine value, 430; content of 1,2-linkage, 65%), 388 g of maleic anhydride, 10 g of xylene and 3.0 g of trimethyl hydroquinone were charged into a 3 lit separable flask fitted with a thermometer, an agitator, a reflux cooling tube and a nitrogen blowing pipe, and reaction was carried out at 190° C. for 5 hours under nitrogen. After non-reacted maleic anhydride and xylene were distilled off, maleinated polybutadiene with a total acid value of 320 mg KOH/g was produced.

Then, 500 g of the maleinated polybutadiene and 300 g of phenoxyethanol were charged into a 2 lit separable flask fitted with a thermometer, an agitator, a reflux cooling tube and a nitrogen blowing tube and dissolved homogeneously. Reaction was then carried out under nitrogen at 130° C. for three hours. After cooling to room temperature, 149 g of 2-(2-aminoethylamino)ethanol were added dropwise over an hour. The temperature was then raised to 125° C., at which temperature the reaction was carried out for four hours to produce a solution of polyamine resin containing imido groups.

Into a 5 lit separable flask fitted with a reflux cooling tube were charged 269 g of 1,2-naphthoquinone azido sulfonyl chloride, 1900 g of dioxane and 300 g of "KYOUWAAD 1000" manufactured by KYOUWA CHEMICAL IND.. Then, 645 g of the polyamine resin solution were added dropwise at 30° C. over two hours and reaction was carried out at this temperature further for five hours. After the produced solution was filtered, 440 g of phenoxy ethanol was added and dioxane was removed under reduced pressure to produce a photosensitive resin (a-5).

The produced resin (a-5) in solution contained 150 mg equivalent of naphthoquinone diazido groups per 100 g of resin, and the non-volatile content amounted to 60.0 wt. %.

Synthesis of Anionic Positive Type Photosensitive Resin (A-6)

750 g of the above mentioned (a-4) resin solution and 670 g of the photosensitive resin (a-5) solution were mixed thoroughly and 60 g of triethylamine was added for neutralization sufficiently to produce an anionic positive type photosensitive resin (A-6) solution.

Synthesis Example 12

Synthesis of Half-Ester (A-7) Solution 1000 g of "NISSEKI POLYBUTADIENE B-1000" (manufactured by NIPPON PETROCHEMICALS CO., LTD.; number average molecular weight, 1,000; iodine value, 430; content of 1,2-linkage, 65%), 554 g of maleic anhydride, 10 g of xylene and 3.0 g of trimethyl hydroquinone, were charged into a 3 lit separable flask fitted with a thermometer, an agitator, a reflux cooling tube and a nitrogen blowing pipe, and reaction was carried out at 190° C. for 5 hours under nitrogen. After non-reacted maleic anhydride and xylene were distilled off, maleinated polybutadiene with a total acid value of 400 mg KOH/g was produced.

Then, into a 3 lit separable flask fitted with a reflux cooling tube, 1000 g of the maleinated polybutadiene, 461.8 g of diethylene glycol dimethyl ether, 3.0 g of N,N-dimethylbenzyl amine and 385.5 g of benzyl alcohol were charged, and dissolved homogeneously. Reaction was carried out under a nitrogen stream at 120° C. for two hours to produce a half ester (A-7) solution. The total acid value of the produced half ester (A-7) solution was 109.3 mg KOH/g and the non-volatile content amounted to 75.0 wt. %.

Synthesis Example 13

Synthesis of Cationic Resin (A-8)

Synthesis of Amine-Added Epoxidated Polybutadiene (a-6)

1000 g of epoxidated liquid polybutadiene (manufactured by NIPPON PETROCHEMICALS CO., LTD. under the trade name of "E-1000-8"; number average molecular weight, 1000; oxirane content, 8%) were charged into a 2 lit separable flask fitted with a thermometer, an agitator and a reflux cooling pipe. After the atmosphere in the system was replaced by nitrogen, 231.2 g of methyl ethanol amine were added and reaction was carried out at 170° C. for five hours. Non-reacted methylethanol amine was distilled off to produce an amine-added epoxidated polybutadiene (a-6) having an amine value of 230.4 mmol/100 g.

Synthesis of Unsaturated Group-Containing Isocyanate (a-7)

Into a 2 lit round-bottomed flask, which might be heated and cooled, and which was fitted with a thermometer, an agitator, a reflux cooling pipe and a dropping funnel, 435.5 g of 2,4-tolylene diisocyanate and 266.1 g of diethylene glycol dimethyl ether were charged. After heated to 40° C., 362.8 g of 2-hydroxyethyl acrylate was added dropwise. Simultaneously, 200 ppm of p-benzoquinone was added. Since heat evolution was noticed by dropwise addition of 2-hydroxy ethyl acrylate, the system was cooled occasionally to maintain a constant temperature. After the end of dropwise addition of 2-hydroxy ethyl acrylate, the temperature was raised to 70° C., at which temperature the reaction was carried out for three hours. After confirming by IR absorption spectral analyses that absorption intensity of the isocyanate groups was reduced to about one half that before start of the reaction, the reaction system was cooled to produce an unsaturated group-containing isocyanate compound (a-7).

Synthesis of Cationic Resin (A-8)

500 g of (a-6) was dissolved in 166.7 g of diethylene glycol dimethyl ether in a 2 lit separable flask. 713.4 g of (a-7) (corresponding to 0.8 equivalent of the isocyanate groups to 1 equivalent of hydroxyl groups in (a-6)) were added dropwise to the resulting solution at 40° C., at which temperature the reaction was carried out for one hour. After confirming by IR absorption spectral analyses that absorption of the isocyanate groups disappeared, the reaction was terminated to obtain a cationic resin (A-8) which was an addition product of (a-7) to (a-6).

Synthesis Example 14

Preparation of Black-Hued Positive Type Photosensitive Coating (B-4)

500 g of the cationic positive type photosensitive resin (A-5) obtained in Synthesis Example 10, were dissolved in 333.3 g of methylethyl ketone. 50 g carbon black #5B, manufactured by MITSUBISHI KASEI CORPORATION were added under agitation for mixing. The resulting mixture was dispersed, using a laboratory 3-roll roll mill, manufactured by KODAIRA SEISAKUSHO KK, until the carbon black particle size was 0.2 μm or less. The particle size was measured using a COULTER counter N4 manufactured by COULTER INC.

Into the dispersion mixture were added 11.7 g of acetic acid as a neutralizer and the resulting mass was again agitated sufficiently and homogenized. The resulting product was dispersed in water under gradual addition of deionized water and vigorous mixing by a high speed mixer, to produce an aqueous solution of a black-hued positive type photosensitive coating (B-4) (cationic electrodeposition type).

Synthesis Example 15

Preparation of Black-Hued Positive Type Photosensitive Coating (B-5)

500 g of the photosensitive resin (A-5) obtained in Synthesis Example 10 were dissolved in 333.3 g of methylethyl ketone and 50 g of carbon black #5B, manufactured by MITSUBISHI KASEI CORPORATION, were added thereto under agitation for mixing. Into the resulting mixture was dispersed a carbon black particle size of not more than 0.2 μm by a laboratory 3-roll roll mill. The particle size was measured using a COULTER counter N4 manufactured by COULTER INC.

The above mentioned dispersion mixture was diluted with methylethyl ketone until the solid concentration reached 40 wt. % to produce a solution of a black-hued positive type photosensitive coating (B-5).

Synthesis Example 16

Preparation of Red-Hued Positive Type Photosensitive Coating (B-6)

The procedure of the Synthesis Example 14 was followed, except using "PIGMENT RED 4BS", azo metal salt type red pigment manufactured by SANYO SHIKISO KK, in place of carbon black #5B manufactured by MITSUBISHI KASEI CORPORATION, to produce an aqueous solution (cationic electrodeposition type) of a red-hued positive type photosensitive coating having a solid concentration of 15 wt. %.

Synthesis Example 17

Preparation of Black-Hued Positive Type Photosensitive Coating (B-7)

To 500 g of the anionic positive type photosensitive resin (A-6) solution obtained in Synthesis Example 11, 35 g of carbon black #5B, manufactured by MITSUBISHI KASEI CORPORATION, were added under agitation for mixing. Then, using a laboratory 3-roll roll mill, manufactured by KODAIRA SEISAKUSHO KK, the resulting mixture was dispersed until the carbon black was not more than 0.2 μm in particle size. The particle size was measured using a COULTER counter N4 manufactured by COULTER INC.

The above dispersion mixture was dispersed in water under gradual addition of deionized water and vigorous agitation by a high speed mixer to produce an aqueous solution of a black-hued positive type photosensitive coating (B-7) (anionic electrodeposition type) having a solid concentration of 15 wt. %.

Synthesis Example 18

Preparation of Colored Coatings (C-7, C-8 and C-9)

Each solution of half esters (A-7) and pigments were mixed under agitation and the pigments were dispersed to have a pigment particle size of 0.3 μm or less by means of a laboratory three-roll roll mill manufactured by KODAIRA SEISAKUSHO KK. To each of the produced dispersion mixtures was added triethylamine as a neutralizer and the resulting mass was again agitated sufficiently and homogenized. Each of the resulting products was dispersed in water under gradual addition of deionized water and vigorous agitation by a high speed mixer, to produce colored coatings (C-7, C-8 and C-9) each having a solid concentration of 10 wt. %. The compositions of aqueous solutions of the produced three color colored coatings (anionic electrodeposition type) are shown in Table 3, wherein the numerals denote parts by weight.

TABLE 3

| Coating No. | C-7 | C-8 | C-9 |
|---|---|---|---|
| Color | Red | Green | Blue |
| Half-Ester (A-7) Solution | 213.3 | 213.3 | 213.3 |
| Triethylamine (Neutralizer) | 21.0 | 21.0 | 21.0 |
| Ion-exchanged water | 1725.7 | 1725.7 | 1725.7 |
| Phthalocyanine Blue(*) | — | — | 20 |
| Phthalocyanine Green(**) | — | 20 | — |
| Azo Metal Salt Red Pigment(***) | 20 | — | — |

(*)SR-150C manufactured by SANYO SHIKISO KK
(**)SAX manufactured by SANYO SHIKISO KK
(***)Pigment Red 4BS manufactured by SANYO SHIKISO KK Synthesis Example 19

Preparation of Colored coatings (C-10, C-11 and C-12)

Each solution of cationic resins (A-8), photopolymerization initiators and pigments were mixed together under agitation and the pigments were dispersed to have a pigment particle size of 0.2 μm or less by a laboratory 3-roll roll mill manufactured by KODAIRA SEISAKUSHO KK. Particle size was measured using a COULTER counter N4 manufactured by COULTER INC. Acetic acid as a neutralizer was added to each of the resulting dispersion mixtures and the resulting mass was again agitated sufficiently and homogenized. Each of the resulting products was dispersed in water under gradual addition of deionized water and under vigorous agitation by a high speed mixer, to produce colored coatings (C-10, C-11, C-12) each having a solids concentration of 10 wt. %. The compositions of the aqueous solutions of the produced three color colored coatings (cationic electrodeposition type) are shown in Table 4, wherein the numerals denote parts by weight.

TABLE 4

| Coating No. | C-10 | C-11 | C-12 |
|---|---|---|---|
| Color | Red | Green | Blue |
| Cationic resin (A-8) solution | 213.3 | 213.3 | 213.3 |
| IRGACURE 907(*) | 11.5 | 11.5 | 11.5 |
| KAYACURE DETX(**) | 1.3 | 1.3 | 1.3 |
| Acetic acid (Neutralizer) | 19.8 | 19.8 | 19.8 |
| Phthalocyanine Blue(***) | — | — | 20 |
| Phthalocyanine Green(****) | — | 20 | — |
| Azo Metal Salt Red Pigment(***) | 20 | — | — |

(*)IRGACURE 907", mfd. by CIBA GEIGY INC.
(**)KAYACURE DETX (mfd. by NIPPON KAYAKU CO., LTD.)
(***)Phthalocyanine Blue "SR-150C" (mfd. by SANYO SHIKISO KK)
(****)Phthalocyanine Green "SAX" (mfd. by SANYO SHIKISO KK)
(*****)Metal Salt Red Pigment "PIGMENT RED 4BS" (mfd. by SANYO SHIKISO KK)

EXAMPLE 1

Electrodeposition was carried out for three minutes under conditions of a dc voltage of 30 V and a temperature of 25° C. with a pyrex glass substrate, 1.1 mm thick, having an indium-tin oxide (ITO) film 80 nm in thickness, as a cathode, and with a stainless steel beaker containing an aqueous solution of a black-hued photosensitive coating (B-1), as an anode. The glass substrate was washed with ion exchanged water, dried at 80° C. for five minutes and subsequently cooled. It was found that a non-tacky uniform black coating film 2 μm in thickness was formed.

A mask exhibiting a light transmittance pattern changing in four different degrees, as shown in FIG. 2, where 1 denotes a mask region in register with a light-intercepting film region with 100% light transmittance, 2 a mask region in register with a first color region with 5% light transmittance, 3 a mask region in register with a second color region with 25% light transmittance and 4 a mask region in register with a third color region with 80% light transmittance region, was intimately contacted with the coating film, and UV rays of 500 mJ/cm$^2$ were irradiated using an UV light exposure device having a high pressure mercury lamp, "JL-3300" manufactured by ORC MANUFACTURING CO., LTD.

After development with an aqueous solution of lactic acid having a concentration of 0.05 wt. %, the black-hued photosensitive coating was selectively removed in a region in register with the lowest light transmittance mask region for laying open (exposing) the ITO film. After washing with water and drying, electrodeposition was carried out for three minutes under conditions of a d.c. voltage of 25 V and a temperature of 25° C. with a glass substrate as an anode and with a stainless steel beaker containing the coating C-1 as a cathode. After the glass substrate was washed with ion exchanged water, the substrate was dried at 80° C. for five minutes to produce a red-hued colored layer, 2 μm in film thickness, not exhibiting tackiness at room temperature. After development with an aqueous solution of 0.5 wt. % lactic acid, it was found that the black-hued photosensitive coating was removed in its region in register with the mask region having the second lowest transmittance, while no changes were produced in the red-hued colored layer and in the remaining layers.

After washing with water and drying, electrodeposition was carried out for three minutes under conditions of a dc voltage of 25 V and a temperature of 25° C. with the glass substrate as an anode and a stainless steel beaker containing the colored coating (C-2) as a cathode. After washing the glass substrate with ion exchanged water, no changes were noticed in the previously formed red-hued colored layer and the remaining layers and a green-hued colored layer was formed. After drying at 80° C. for five minutes and development with an aqueous solution of 3.0 wt. % lactic acid, no changes were noticed in the red-hued and green-hued colored regions and in the remaining regions and the black-hued photosensitive coating region in register with the third lowest light transmittance mask region was removed.

After washing with water and drying, electrodeposition was carried out for three minutes under conditions of dc voltage of 25 V and a temperature of 25° C. with the glass substrate as an anode and a stainless steel beaker containing the colored coating (C-3) as a cathode. After the glass substrate was washed with ion exchanged water, no changes were noticed in the previously formed red-hued colored layer, the green-hued colored layer and the light intercepting layer, but a blue-hued colored layer was produced. After drying at 80° C. for five minutes, the glass substrate was baked at 175° C. for 30 minutes for complete curing. After curing, the respective colored layers were each 1.9 μm in thickness and a color filter having uniform colored layers excellent in transparency could be produced.

EXAMPLE 2

Electrodeposition was carried out for three minutes under conditions of a dc voltage of 25 V and a temperature of 25° C. with the same glass substrate as that used in Example 1 as an anode and a stainless steel beaker containing a black-hued photosensitive coating (B-2) as a cathode. After the glass substrate was washed with ion exchanged water, drying was carried out at 80° C. for five minutes. A non-tacky black-hued uniform coating film, 1.8 μm in thickness, was produced.

A mask similar to that used in Example 1 was placed in intimate contact with the coating film and, using a UV irradiation unit used in Example 1, UV rays of 800 mJ/cm$^2$ were irradiated on the mask. After development with an aqueous solution of sodium carbonate with a concentration of 0.1 wt. %, the black-hued photosensitive coating in register with a lowest transmittance mask region was selectively removed, so that the ITO film was laid open.

After washing with water and drying, electrodeposition was then carried out for three minutes under conditions of a dc voltage of 30 V and a temperature of 25° C. with the glass substrate as a cathode and with a stainless steel beaker containing the colored coating (C-4) as an anode. After the glass substrate was washed with ion exchanged water, the substrate was dried at 80° C. for five minutes for forming a red-hued colored layer. After development with an aqueous solution of 0.75 wt. % sodium carbonate, no changes were noticed in the red-hued color layer, whereas the black-hued photosensitive coating was selectively removed in a region thereof in register with the second lowest light transmittance mask region.

After washing with water and drying, electrodeposition was carried out for three minutes under conditions of a dc voltage of 30 V and a temperature of 25° C. with the glass substrate as a cathode and with a stainless steel beaker containing the colored coating (C-5) as an anode. After washing the glass substrate with ion exchanged water, no changes were noticed in the previously produced red-hued colored layer and a green-hued color region was produced. After drying at 80° C. for five minutes, followed by development with an aqueous solution of 5 wt. % sodium metasilicate, no changes were noticed in the red- and green-hued colored layers or in the light-intercepting layer, but the black-hued photosensitive coating was selectively removed in a region in register with the third lowest transmittance mask region.

After washing with water and drying, electrodeposition was carried out for 3 minutes under conditions of dc voltage of 30 V and a temperature of 25° C. with the glass substrate as a cathode and with a stainless steel beaker containing the colored coating (C-6) as an anode. After the glass substrate was washed with ion exchanged water, no changes were noticed in the previously formed red-hued and green-hued colored layers and in the light intercepting layer, but a blue-hued colored layer was formed. After drying at 80° C. for five minutes, the substrate was baked at 170° C. for 30 minutes. After curing, the color layers and the light intercepting layer were 1.8 μm thick, and a color filter having uniform colored layers with superior transparency was produced.

EXAMPLE 3

A glass substrate which was the same as that used in Example 1 was spray-coated with a coating (B-3) in solution sensitive to black and dried in air at 80° C. for five minutes. A non-tacky black-hued homogeneous coating film with a film thickness of 1.5 μm was produced.

A mask same as that used in Example 1 was intimately contacted with the coating film and, using a UV exposure device "JL-3300" manufactured by ORC MANUFACTURING CO., LTD. having a high pressure mercury lamp, UV rays of 500 mJ/cm$^2$ were irradiated on the mask. After development with an aqueous solution of lactic acid with a concentration of 0.05 wt. %, the black-hued photosensitive coating was selectively removed in a region in register with a lowest transmittance mask region, so that the ITO film was exposed.

After washing with water and drying, electrodeposition was then carried out for three minutes under conditions of a dc voltage of 25 V and a temperature of 25° C. with the glass substrate as an anode and with a stainless steel beaker containing the colored coating (C-1) as a cathode. After the glass substrate was washed with ion exchanged water, the substrate was dried at 80° C. for five minutes for forming a red-hued color layer. After development with an aqueous solution of 0.5 wt. % lactic acid, no changes were noticed in the red-hued colored layer, whereas the black-hued photosensitive coating was selectively removed in a region thereof in register with the second lowest light transmittance mask region.

After washing with water and drying, electrodeposition was carried out for three minutes under conditions of dc voltage of 25 V and a temperature of 25° C. with the glass substrate as an anode and with a stainless steel beaker containing a colored coating (C-2) as a cathode. After washing the glass substrate with ion exchanged water, no changes were noticed in the previously produced red-hued color layer, and a green-hued color region was produced. After drying at 80° C. for five minutes, followed by development with an aqueous solution of 3.0 wt. % lactic acid, no changes were noticed in the red- and green-hued colored layers, but the black-hued photosensitive coating was selectively removed in a region in register with the third lowest transmittance mask region.

After washing with water and drying, electrodeposition was carried out under conditions of dc voltage of 25 V and a temperature of 25° C. with the glass substrate as an anode and with a stainless steel beaker containing the colored coating (C-3) as a cathode. After the glass substrate was washed with ion exchanged water, no changes were noticed in the previously formed red-hued and green-hued colored layers and in the light intercepting layer, but a blue-hued colored layer was formed. After drying at 80° C. for five minutes, the substrate was baked at 175° C. for 30 minutes. After curing, the colored layers and the light intercepting layer were 1.5 µm thick, and a color filter having uniform colored layers with superior transparency was produced.

EXAMPLE 4

Electrodeposition was carried out for 60 seconds under conditions of a dc voltage of 40 V and a temperature of 25° C., using a glass substrate, which was the same as that used in Example 1, referred to hereinafter as a master plate 1, as a cathode and with a stainless steel beaker containing an aqueous solution of a black-hued positive type photosensitive coating (B-4) as an anode. After the master plate 1 was washed with ion exchanged water, the master plate was dried at 80° C. for five minutes and subsequently cooled. A non-tacky black-hued homogeneous coating film having a film thickness of 2 µm was formed.

Then, a mask having a transmittance pattern changing in four degrees, as shown in FIG. 2, wherein 1, 2, 3 and 4 denote a region with 1% transmittance corresponding to a light intercepting film, a region with 100% transmittance corresponding to a first color, a region with 50% transmittance corresponding to a second color and a region with 25% transmittance corresponding to a third color, was intimately contacted with the coating film and, using a light exposure device same as that used in Example 1, UV rays with 500 mJ/cm$^2$ were irradiated on the mask.

Then, after development with a 0.3 wt. % aqueous solution of sodium metasilicate, the black-hued positive type photosensitive coating was selectively removed in a region in register with the highest transmittance region of the mask, so that the ITO film was exposed. After washing with water and drying, electrodeposition was carried out for three minutes under conditions of dc voltage of 25 V and temperature of 25° C. with the master plate 1 as an anode and with a stainless steel beaker containing the colored coating (C-7) as a cathode. After washing the master plate 1 with ion exchanged water, it was dried at 80° C. for five minutes and a red-hued color layer, 2 µm in thickness, exhibiting no tackiness at room temperature was produced. After development with a 0.5 wt. % aqueous solution of sodium metasilicate, the black-hued positive type photosensitive coating was selectively removed in a region in register with the second highest transmittance mask region, while no changes were produced in the remaining layers including the red-hued color layer.

After washing with water and drying, electrodeposition was carried out for three minutes under conditions of a dc voltage of 25 V and a temperature of 25° C. with the master plate 1 as an anode and with a stainless steel beaker containing a colored coating (C-8), as a cathode. After the master plate 1 was washed with ion exchanged water, a green-hued colored layer was formed, while no changes were caused in the remaining layers inclusive of the previously formed red-hued colored layer. After drying at 80° C. for five minutes, followed by development with a 3.0 wt. % aqueous solution of sodium metasilicate, the black-hued positive type photosensitive coating was selectively removed in a region thereof in register with the third highest transmittance mask region.

After washing with water and drying, electrodeposition was carried out for three minutes under conditions of a dc voltage of 25 V and a temperature of 25° C. with the master plate 1 as an anode and with a stainless steel beaker containing a colored coating (C-9), as a cathode. After the master plate 1 was washed with ion exchanged water, no changes were caused in the previously formed red- and green-hued colored layers and in the light intercepting layer, but a blue-hued colored layer was produced. After drying at 80° C. for five minutes, the master plate 1 was baked at 175° C. for 30 minutes for complete curing. After curing, the respective colored layers and the itercepting layer were 1.9 µm thick, and a color filter having uniform colored layers with excellent transparency was produced.

EXAMPLE 5

Electrodeposition was carried out for two minutes under conditions of a dc voltage of 45 V and a temperature of 25° C. with a glass substrate, same as that used in Example 1, referred to hereinafter as a master plate 2, as an anode and with a stainless steel beaker containing an aqueous solution of black-hued positive type photosensitive coating (B-7), as a cathode. After washing the master plate 2 with ion exchanged water, a non-tacky black-hued uniform coating film with a film thickness of 1.8 μm was produced.

A mask same as that used in Example 4 was intimately contacted with the coating film and, using a UV light exposure device same as that used in Example 1, UV rays of 800 mJ/cm² were irradiated on the mask. After development with a 0.1 wt. % aqueous solution of sodium carbonate, the black-hued positive type photosensitive coating was selectively removed in a region thereof in register with the maximum transmittance mask region.

After washing with water and drying, electrodeposition was carried out for three minutes under conditions of dc voltage of 30 V and temperature of 25° C. with the master plate 2 as a cathode and with a stainless steel beaker containing a colored coating (C-10) as an anode. After washing the master plate 2 with ion exchanged water, it was dried at 80° C. for five minutes to form a red-hued color layer. Then, after development with a 1.5 wt. % aqueous solution of sodium metasilicate, no changes were produced in the red-hued color layer and the black-hued positive type photosensitive coating was selectively removed in a region thereof in register with the second highest light transmittance mask region.

Then, after washing with water and drying, electrodeposition was carried out for three minutes under conditions of a dc voltage of 30 V and a temperature of 25° C. with the master plate 2 as a cathode and with a stainless steel beaker containing the colored coating (C-11) as an anode. After washing the master plate 2 with ion exchanged water, no changes were caused in the previously generated red-hued colored layer, but a green-hued colored layer was produced. After drying at 80° C. for five minutes followed by development with a 4 wt. % aqueous solution of sodium metasilicate, the black-hued positive type photosensitive coating was selectively removed in a region thereof in register with the third highest transmittance mask region without producing changes in the red- and green-hued color regions and in the region providing the light intercepting film.

After washing with water and drying, electrodeposition was carried out for three minutes under conditions of a dc voltage of 30 V and a temperature of 25° C. with the master plate 2 as a cathode and with a stainless steel beaker containing the colored coating (C-12) as an anode. After washing the master plate 2 with ion exchanged water, no changes were produced in the previously formed red- and green-hued colored layers or in the light intercepting layer, but a blue-hued colored layer was produced. After drying at 80° C. for five minutes, UV rays of 400 mJ/cm² were irradiated, using the above mentioned UV light exposure device, and baking was effected at 150° C. for 10 minutes. The cured colored layers and the light intercepting layer were 1.9 μm thick, and a color filter having uniform colored layers with excellent transparency was produced.

EXAMPLE 6

The black-hued positive type photosensitive coating in solution (B-5) was coated by a spin coating method on a substrate same as that used in Example 1. The substrate was dried in air and then at 80° C. to produce a non-tacky black-hued uniform coating film 1.9 μm thick.

A mask same as that used in Example 4 was intimately contacted with the coating film. Using a UV light exposure device same as that used in Example 1, UV rays of 400 mJ/cm² were irradiated, and development and electrodeposition were carried out in the same manner as in Example 1 to produce a color filter 1.9 μm in film thickness having uniform colored layers with excellent transparency.

EXAMPLE 7

Electrodeposition was carried for 60 seconds under conditions of dc voltage of 40 V and a temperature of 25° C. with a soda glass substrate, 1.1 mm in thickness, having an ITO (indium-tin oxide) film 150 nm in thickness on its surface, referred to hereinafter as a master plate 3, as a cathode, and with a stainless steel beaker containing an aqueous solution of red-hued positive type photosensitive coating (B-6) as an anode. After washing the master plate 3 with ion exchanged water, followed by drying at 80° C. for five minutes and cooling, a red-hued non-tacky uniform coating film 2 μm in thickness was produced.

A mask having a transmittance pattern changing in three degrees, as shown in FIG. 3, in which 5, 6 and 7 denote a region of 1% transmittance corresponding to a third color hue, a region of 100% transmittance corresponding to a first color hue and a region of 25% transmittance corresponding to a second color hue, was intimately contacted with the coating film and, using a UV light exposure device same as that used in Example 1, UV rays of 400 mJ/cm² were irradiated on the mask. After development with a 1.3 wt. % aqueous solution of sodium metasilicate, the red-hued positive type photosensitive coating was selectively removed in a region thereof in register with the highest transmittance mask region to expose the ITO film. After washing with water and drying, electrodeposition was carried out for three minutes under conditions of dc voltage of 25 V and a temperature of 25° C. with the master plate 3 as an anode and with a stainless steel beaker containing a colored coating (C-8) as a cathode. After washing the master plate 3 with ion exchanged water, it was dried at 80° C. for five minutes. In this manner, a green-hued color layer, 2 μm thick, not exhibiting tackiness at room temperature, was formed. After development with a 3.0 wt. % aqueous solution of sodium metasilicate, no changes were produced in the red-hued or green-hued positive type photosensitive coatings, but the red-hued positive type photosensitive coating was selectively removed in a region in register with the second highest transmittance mask region. After washing with water and drying, the colored coating (C-9) was electrodeposited for three minutes under dc voltage of 25 V and a temperature of 25° C., as in the case of electrodeposition of the colored coating (C-8), and the substrate was washed with ion exchanged water. It was found that no changes were caused in the previously formed red-hued or green-hued colored layers, but a blue-hued colored layer was produced. The colored layers were dried at 80° C. for five minutes. For completing the curing, baking was effected at 160° C. for 30 minutes. Each of the colored layers after curing was 1.9 μm thick, and a color filter having uniform colored layers having excellent transparency could be produced.

EXAMPLE 8

A solution obtained on dissolving the cationic positive type photosensitive resin (A-5) in methylethyl ketone was applied on a substrate same as that used in Example 1 (referred to hereinafter as master plate 4) by spin coating, and the master plate 4 was air-dried and then dried at 80° C. for five minutes, for forming a non-tacky uniform coating film 3 μm in thickness.

A mask same as that used in Example 4 was intimately contacted with the coating film and, using a light exposure device same as that used in Example 1, UV rays of 150 mJ/cm$^2$ were irradiated on the mask. After development with a 0.3 wt. % aqueous solution of sodium metasilicate, only a substrate region in register with the largest transmittance mask region was removed to expose the ITO film.

After washing with water and drying, electrodeposition was carried out for three minutes under conditions of a dc voltage of 25 V and a temperature of 25° C. with the master plate 4 as an anode and with a stainless steel beaker containing the colored coating (C-7) as a cathode. After washing the master plate 4 with ion exchanged water, it was dried at 80° C. for 5 minutes to form a red-hued colored layer having a film thickness of 2 μm. After development with a 1.3 wt. % aqueous solution of sodium metasilicate, no changes were noticed in the red-hued colored layer or in the remaining positive type photosensitive coating film portions, but only the positive type photosensitive coating was selectively removed in a region thereof in register with the second highest transmittance mask region.

After washing with water and drying, electrodeposition of the colored coating (C-8) was carried out for three minutes under conditions of a dc voltage of 25 V and a temperature of 25° C. in the same way as in electrodeposition of the colored coating (C-7) and the master plate 4 was then washed with ion exchanged water. It was found that no changes were caused in the previously formed red-hued colored layer or in the residual positive type photosensitive coating film, but a green-hued colored layer was formed. After drying at 80° C. for 5 minutes, followed by development with a 3.0 wt. % aqueous solution of sodium metasilicate, no changes were produced in the red-hued or green-hued colored layers, but only the positive photosensitive coating was selectively removed in a region thereof in register with the third transmittance mask region.

After washing with water and drying, the colored coating (C-9) was electrodeposited for three minutes under conditions of a dc voltage of 25 V and a temperature of 25° C. in the same manner as in the colored coating (C-7). The master plate 4 was then washed with ion exchanged water. It was found that no changes were produced in the previously formed red- or green-hued colored layers or in the residual positive type photosensitive coating film portions, but a blue-hued colored layer was formed. After drying at 80° C. for five minutes, followed by development with a 5.0 wt. % aqueous solution of sodium metasilicate to remove the remaining positive type photosensitive coating film, and then washing with water and drying, the black-hued photosensitive coating (B-7) was electrodeposited for two minutes under dc voltage of 50 V. The master plate 4 was washed with ion exchanged water and dried at 80° C. for five minutes to produce a colored layer having a light intercepting layer. The substrate was then baked at 160° C. for 30 minutes to complete the curing. After curing, the colored layers and the light intercepting layer were of a film thickness of 2.0 μm, and thus a color filter having uniform colored layers with excellent transparency could be obtained.

Although the present invention has been described with reference to the preferred examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims.

What is claimed is:

1. A method for producing a color filter comprising the steps of:
   (A) forming a photosensitive coating film on a transparent electrically conductive layer formed on a surface of a transparent substrate, and exposing said photosensitive coating film to light through a mask having patterns of at least three different degrees of light transmittances;
   (B) developing and removing a photosensitive coating film portion registering with one of said patterns of smallest and largest degrees of light transmittances for exposing said transparent electrically conductive layer, and electrodepositing a colored coating on the exposed transparent electrically conductive layer for forming a colored layer thereon; and
   (C) repeating said step (B) for the respective patterns of different degrees of light transmittances in sequence of difference in transmittances for producing different colored layers, respectively.

2. A method as claimed in claim 1 wherein a material of said transparent electrically conductive layer is selected from the group consisting of tin oxide, indium oxide, antimony oxide and mixtures thereof.

3. A method as claimed in claim 1 wherein said photosensitive coating film is formed by a method selected from the group consisting of electrodeposition, spraying, dip coating, roll coating, screen printing and spin coating.

4. A method as claimed in claim 1 wherein said photosensitive coating film is formed of a negative type photosensitive coating containing a negative type photosensitive coating resin exhibiting coating film forming capability and photosensitivity, a photopolymerization initiator and a solvent selected from the group consisting of an organic solvent and water.

5. A method as claimed in claim 4 wherein said negative type photosensitive coating resin has a molecular weight ranging between 500 and 10,000.

6. A method as claimed in claim 4 wherein said negative type photosensitive coating resin is a prepolymer selected from the group consisting of epoxy (meth)acrylate, urethane (meth)acrylate, polyester (meth)acrylate and mixtures thereof.

7. A method as claimed in claim 4 wherein said negative type photosensitive coating resin is an onium group-containing cationic resin prepared by introducing an onium group and a photosensitive group into a main resin and processing with an acidic material, said main resin being selected from the group consisting of acrylic resin, polyester resin, maleinated oil resin, epoxy resin, urethane resin, polybutadiene resin, polyamide resin and mixtures thereof, said onium group being selected from the group consisting of an amino group, an ammonium group, a sulfonium group and mixtures thereof, said photosensitive group being selected from the group consisting of an acryloyl group, a methacryloyl group, a cinnamoyl group and mixtures thereof, and said acidic material being selected from the group consisting of formic acid, acetic acid, propionic acid, lactic acid and mixtures thereof.

8. A method as claimed in claim 4 wherein said negative type photosensitive coating resin is a carboxyl group-containing anionic resin obtained by introducing a carboxyl group and a photosensitive group into a main resin and processing with a basic substance, said main resin being selected from the group consisting of acrylic resin, polyester resin, maleinated oil resin, polybutadiene resin, epoxy resin, urethane resin, polyamide resin and mixtures thereof, said photosensitive group being selected from the group consisting of an acryloyl group, a methacryloyl group, a cinnamoyl group and mixtures thereof, said basic substance being selected from the group consisting of triethylamine, diethylamine, dimethylethanol amine, ammonia and mixtures thereof.

9. A method as claimed in claim 4 wherein said photopolymerization initiator is selected from the group consisting of benzoins, benzoin ethers, benzylalkyl ketals, benzophenone derivatives, anthraquinone derivatives, thioxanthone derivatives and mixtures thereof.

10. A method as claimed in claim 4 wherein an added amount of said photopolymerization initiator is 0.1 to 30 parts by weight to 100 parts by weight of said negative type photosensitive coating resin.

11. A method as claimed in claim 4 wherein said organic solvent is selected from the group consisting of ethyleneglycol monobutyl ether, ethyleleglycol monohexyl ether, ethyleneglycol monophenyl ether, propyleneglycol monomethyl ether, propylneglycol monophenyl ether, diethyleneglycol dimethyl ether, triethyleneglycol dimethyl ether, acetone, methylethyl ketone, methylisobutyl ketone, cyclohexanone, isophorone, dibutyl ether, dioxane, tetrahydrofuran, methoxy butanol, diacetone alcohol, butanol, isopropanol, toluene, xylene, hexane, ethyl acetate, butyl acetate, 2-methoxyethyl acetate, 2-methoxypropyl acetate, ethyl benzoate, dimethyl formamide, N,N-dimethyl acetoamide, dimethyl sulfoxide and mixtures thereof.

12. A method as claimed in claim 4 wherein said negative type photosensitive coating contains a colorant selected from the group consisting of dyes, pigments and mixtures thereof.

13. A method as in claim 12 wherein said dyes comprise the group consisting of azo dyes, anthraquinone dyes, benzodifuranone dyes, condensed methine dyes and mixtures thereof.

14. A method as claimed in claim 12 wherein said pigments comprise the group consisting of azo lake organic pigments, quinacridone organic pigments, phthalocyanine organic pigments, isoindolinone organic pigments, anthraquinone organic pigments, thioindigo organic pigments, chrome yellow, iron oxide, chrome vermilion, chrome green, ultramarine, prussian blue, cobalt blue, cobalt green, emerald green, titanium white, carbon black and mixtures thereof.

15. A method as claimed in claim 12 wherein said colorant is used in an amount of 3 to 70 wt. % based on a total amount of the negative type photosensitive coating.

16. A method as claimed in claim 1 wherein said photosensitive coating film is formed of a positive type photosensitive coating containing a positive type photosensitive coating resin having coating film forming capability and photosensitivity and a solvent selected from the group consisting of an organic solvent and water.

17. A method as claimed in claim 16 wherein said positive type photosensitive coating resin is a quinone diazido group-containing cationic resin obtained by introducing an onium group and a hydroxyl group into a main resin, adding a quinone diazido sulfonic acid compound by esterification reaction and processing with an acidic material, said main resin being selected from the group consisting of acrylic resin, polyester resin, maleinated oil resin, epoxy resin, urethane resin, polybutadiene resin, polyamide resin and mixtures thereof, said onium group being selected from the group consisting of an amino group, an ammonium group, a sulfonium group and mixtures thereof, and said acidic material being selected from the group consisting of formic acid, acetic acid, propionic acid, lactic acid and mixtures thereof.

18. A method as claimed in claim 16 wherein said positive type photosensitive coating resin is a quinone diazido group-containing anionic resin obtained by introducing a carboxyl group and a hydroxyl group into a main resin, adding a quinone diazido sulfonic acid compound by esterification reaction and processing with a basic substance, said main resin being selected from the group consisting of acrylic resin, polyester resin, maleinated oil resin, polybutadiene resin, epoxy resin, urethane resin, polyamide resin and mixtures thereof, and said basic substance being selected from the group consisting of triethylamine, diethylamine, dimethylethanol amine, ammonia and mixtures thereof.

19. A method as claimed in claim 16 wherein said positive type photosensitive coating resin is a quinone diazido group-containing resin obtained by reacting a resin having film forming capability and a hydroxyl group-containing compound with a quinone diazido compound, said quinone diazido compound being selected from the group consisting of a quinone diazido sulfonic acid derivative-containing quinone diazido compound and an isocyanate group-containing quinone azido compound.

20. A method as claimed in claim 16 wherein said organic solvent is selected from the group consisting of ethyleneglycol monobutyl ether, ethylglycol monohexyl ether, ethyleneglycol monophenyl ether, propyleneglycol monomethyl ether, propyleneglycol monophenyl ether, diethyleneglycol dimethyl ether, triethyleneglycol dimethyl ether, acetone, methylethyl ketone, methylisobutyl ketone, cyclohexanone, isophorone, dibutyl ether, dioxane, tetrahydrofuran, methoxy butanol, diacetone alcohol, butanol, isopropanol, toluene, xylene, hexane, ethyl acetate, butyl acetate, 2-methoxyethyl acetate, 2-methoxypropyl acetate, ethyl benzoate, dimethylformamide, N,N-dimethyl acetoamide, dimethyl sulfoxide and mixtures thereof.

21. A method as claimed in claim 16 wherein said positive type photosensitive coating contains a colorant selected from the group consisting of dyes, pigments and mixtures thereof.

22. A method as claimed in claim 21 wherein said dyes comprise the group consisting of azo dyes, anthraquinone dyes, benzodifuranone dyes, condensed methine dyes and mixtures thereof.

23. A method as claimed in claim 21 wherein said pigments comprise the group consisting of azo lake organic pigments, quinacridone organic pigments, phthalocyanine organic pigments, isoindolinone organic pigments, anthraquinone organic pigments, thioindigo organic pigments, chrome yellow, iron oxide, chrome vermilion, chrome green, ultramarine, prussian blue, cobalt blue, cobalt green, emerald green, carbon black and mixtures thereof.

24. The method as claimed in claim 21 wherein 3 to 70 wt. % of said colorant is contained based on total weight of said positive type photosensitive coating.

25. A method as claimed in claim 1 wherein said mask is a negative mask and wherein said sequence is in an order of increasing light transmittances.

26. A mask as claimed in claim 1 wherein said mask is a positive mask and wherein said sequence is in an order of decreasing light transmittances.

27. A method as claimed in claim 1 wherein said photosensitive coating film is developed and removed by a developing solution selected from the group consisting of an aqueous solution containing an acidic material dissolved therein, an aqueous solution containing a basic material dissolved therein, alcohols, glycol ethers, ketones and chlorinated hydrocarbons.

28. A method as claimed in claim 27 wherein said acidic material is selected from the group consisting of formic acid, acetic acid, propionic acid, lactic acid, hydrochloric acid, phosphoric acid and mixtures thereof.

29. A method as claimed in claim 27 wherein said basic material is selected from the group consisting of sodium carbonate, sodium hydrogen carbonate, sodium metasilicate, tetraalkyl ammonium hydroxide, sodium hydroxide, potassium hydroxide and mixtures thereof.

30. A method as claimed in claim 1 wherein said photosensitive coating film is developed and removed under conditions of a temperature of 10° to 70° C. and a developing time of 5 to 600 seconds.

31. A method as claimed in claim 1 wherein said colored coating is obtained by processing a film-forming component and a colorant component with a material selected from the group consisting of an acidic substance and a basic substance, said film-forming component being selected from the group consisting of cationic resins, anionic resins and photocurable resins, said colorant component being selected from the group consisting of dyes, pigments and mixtures thereof, said acidic substance being selected from the group consisting of formic acid, acetic acid, propionic acid, lactic acid and mixtures thereof, and said basic substance being selected from the group consisting of triethylamine, diethylamine, diethylethanol amine, ammonia and mixtures thereof.

32. A method as claimed in claim 31 wherein said film-forming component comprises a cationic resin obtained by introducing an onium group into a main resin, said main resin being selected from the group consisting of acrylic resin, polyester resin, maleinated oil resin, epoxy resin, urethane resin, polybutadiene resin, polyamide resin and mixtures thereof, and said onium group being selected from the group consisting of an amino group, an ammonium group, a sulfonium group and mixtures thereof.

33. A method as claimed in claim 31 wherein said film-forming component comprises an anionic resin obtained by introducing a carboxyl group into a main resin selected from the group consisting of acrylic resin, polyester resin, maleinated oil resin, polybutadiene resin, epoxy resin, urethane resin, polyamide resin and mixtures thereof.

34. A method as claimed in claim 31 wherein said photocurable resins contain a functional group selected from the group consisting of an acryloyl group, a methacryloyl group, a cinnamoyl group and mixtures thereof in a molecule thereof.

35. A method as claimed in claim 31 wherein said photocurable resins comprise a photopolymerization initiator selected from the group consisting of benzoins, benzoin ethers, benzylalkyl ketals, benzophenone derivatives, anthraquinone derivatives, thioxanthone derivatives and mixtures thereof.

36. A method as claimed in claim 31 wherein said dyes comprise the group consisting of azo dyes, anthraquinone dyes, benzodifuranone dyes, condensed methine dyes and mixtures thereof.

37. A method as claimed in claim 31 wherein said pigments comprise the group consisting of azo lake organic pigments, quinacridone organic pigments, phthalocyanine organic pigments, isoindolinone organic pigments, anthraquinone organic pigments, thioindigo organic pigments, chrome yellow, iron oxide, chrome vermilion, chrome green, ultramarine, prussian blue, cobalt blue, cobalt green, emerald green, titanium white, carbon black and mixtures thereof.

38. A method as claimed in claim 1 wherein said colored coating is electrodeposited at an electrical voltage of 5 to 500 V dc for a time interval of 5 to 300 seconds and at a liquid temperature of 10° to 35° C.

39. A method as claimed in claim 1 further comprising a step of curing by heating at 100° to 250° C. for 5 minutes to one hour.

40. A method as claimed in claim 1 further comprising a step of photocuring.

* * * * *